(12) United States Patent
Sim et al.

(10) Patent No.: US 8,835,220 B2
(45) Date of Patent: Sep. 16, 2014

(54) BACKSIDE MOLD PROCESS FOR ULTRA THIN SUBSTRATE AND PACKAGE ON PACKAGE ASSEMBLY

(71) Applicant: Intel Corporation, Santa Clara, CA (US)

(72) Inventors: Huay Huay Sim, Penang (MY); Choong Kooi Chee, Penang (MY); Kein Fee Liew, Perak (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/776,189

(22) Filed: Feb. 25, 2013

(65) Prior Publication Data

US 2013/0230946 A1    Sep. 5, 2013

Related U.S. Application Data

(62) Division of application No. 12/164,390, filed on Jun. 30, 2008, now Pat. No. 8,384,223.

(51) Int. Cl.
*H01L 21/56* (2006.01)

(52) U.S. Cl.
USPC .... 438/107; 438/111; 257/777; 257/E21.499; 257/E23.069

(58) Field of Classification Search
USPC .......................... 257/678, 686, 777; 438/107
See application file for complete search history.

(56) References Cited

U.S. PATENT DOCUMENTS

| | | | |
|---|---|---|---|
| 6,050,481 A | 4/2000 | Chapman et al. | |
| 6,404,062 B1 | 6/2002 | Taniguchi et al. | |
| 6,713,366 B2 | 3/2004 | Mong et al. | |
| 7,005,317 B2 | 2/2006 | Chin et al. | |
| 7,172,951 B2 | 2/2007 | Chin et al. | |
| 8,384,223 B2 | 2/2013 | Sim et al. | |
| 2002/0068453 A1 | 6/2002 | Grigg et al. | |
| 2002/0121695 A1 | 9/2002 | Stephenson et al. | |
| 2007/0023891 A1 | 2/2007 | Reiss et al. | |
| 2007/0096292 A1 | 5/2007 | Machida | |
| 2007/0152326 A1 | 7/2007 | Lim et al. | |
| 2007/0187810 A1 | 8/2007 | Mok et al. | |
| 2008/0280397 A1 | 11/2008 | Kim et al. | |
| 2009/0321949 A1 | 12/2009 | Sim et al. | |

OTHER PUBLICATIONS

"U.S. Appl. No. 12/164,390 , Response filed Apr. 23, 2012 to Non Final Office Action mailed Dec. 21, 2011", 6 pgs.
"U.S. Appl. No. 12/164,390, Final Office Action mailed Dec. 8, 2010", 8 pgs.
"U.S. Appl. No. 12/164,390, Non Final Office Action mailed Jun. 24, 2010", 13 pgs.
"U.S. Appl. No. 12/164,390, Non Final Office Action mailed Dec. 21, 2011", 10 pgs.
"U.S. Appl. No. 12/164,390, Notice of Allowance mailed Jul. 3, 2012", 7 pgs.
"U.S. Appl. No. 12/164,390, Response Filed Sep. 24, 2010 to Non Final Office Action mailed Jun. 24, 2010", 9 pgs.

*Primary Examiner* — Mamadou Diallo
(74) *Attorney, Agent, or Firm* — Schwegman Lundberg & Woessner, P.A.

(57) ABSTRACT

In some embodiments, selective electroless plating for electronic substrates is presented. In this regard, a method is introduced including receiving a coreless substrate strip, forming a stiffening mold on a backside of the coreless substrate strip adjacent to sites where solder balls are to be attached, and attaching solder balls to the backside of the coreless substrate strip amongst the stiffening mold. Other embodiments are also disclosed and claimed.

14 Claims, 2 Drawing Sheets

BACKSIDE MOLD PROCESS FOR ULTRA THIN SUBSTRATE AND PACKAGE ON PACKAGE ASSEMBLY

PRIORITY APPLICATION

This application is a divisional of U.S. application Ser. No. 12/164,390, filed Jun. 30, 2008, which is incorporated herein by reference in its entirety.

FIELD OF THE INVENTION

Embodiments of the present invention generally relate to the field of integrated circuit packages, and, more particularly to backside mold process for ultra thin substrate and package on package assembly.

BACKGROUND OF THE INVENTION

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores).

Disadvantageously, with a thin or no-core substrate, however, decrease in yield at first level chip attach due to warpage causing nonwets may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
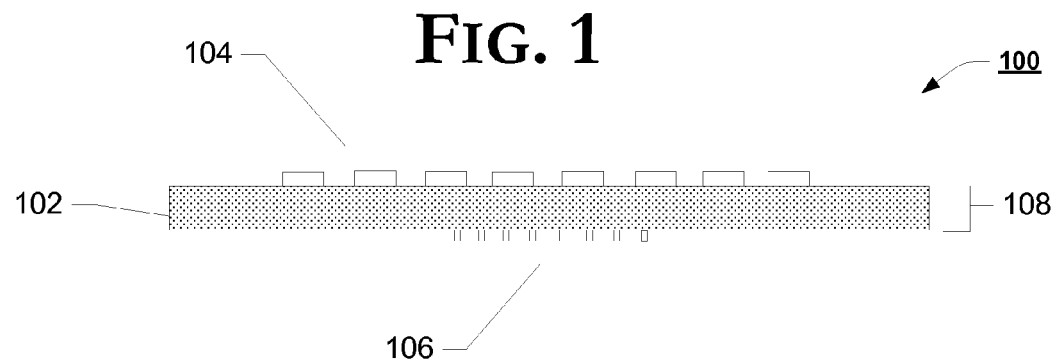
FIG. 1 is a graphical illustration of a cross-sectional view of a partially formed IC package, in accordance with one example embodiment of the invention.

FIG. 1 is a graphical illustration of a cross-sectional view of a partially formed IC package, in accordance with one example embodiment of the invention. In accordance with the illustrated example embodiment, package 100 includes one or more of coreless substrate strip 102, backside contacts 104, topside contacts 106 and substrate thickness 108.

Coreless substrate strip 102 represents a thin substrate that may be rolled out and processed before being singulated. In one embodiment, coreless substrate strip 102 is a direct laser lamination generation 3 (DLL3) strip. In one embodiment, substrate thickness 108 is about 200 micrometers.

Figure 2:
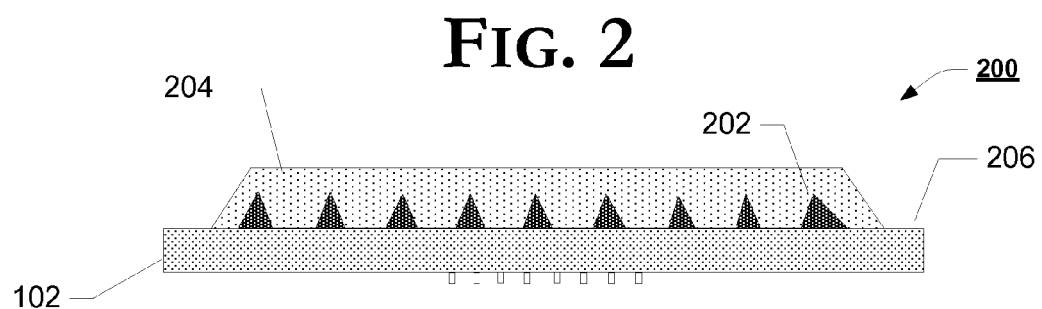
FIG. 2 is a graphical illustration of a cross-sectional view of a partially formed IC package, in accordance with one example embodiment of the invention.

FIG. 2 is a graphical illustration of a cross-sectional view of a partially formed IC package, in accordance with one example embodiment of the invention. As shown in package 200, mold compound 202 is dispensed as a liquid on backside 206 and compressed by mold form 204. In one embodiment, mold form 204 is a jig designed to compress mold compound 202 adjacent to sites where solder balls are to be attached. Mold form 204 may be held in place for some time and may be heated to allow mold compound 202 to cure.

Figure 3:
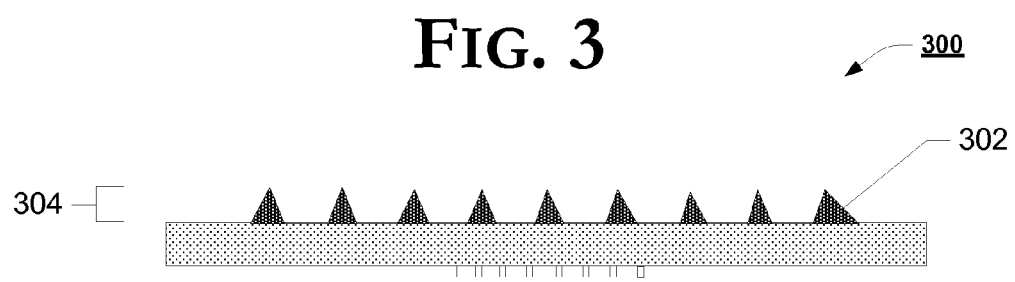
FIG. 3 is a graphical illustration of a cross-sectional view of a partially formed IC package, in accordance with one example embodiment of the invention.

FIG. 3 is a graphical illustration of a cross-sectional view of a partially formed IC package, in accordance with one example embodiment of the invention. As shown in package 300, stiffening mold 302 is cured and provides added stiffness to package 300. In one embodiment, stiffening mold 302 has a mold thickness 304 of about 100 micrometers.

Figure 4:
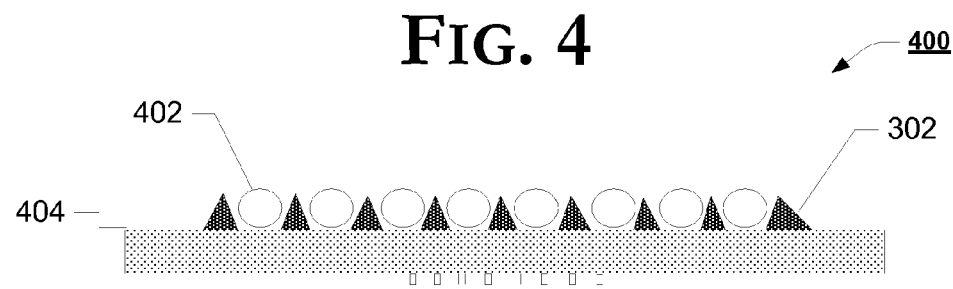
FIG. 4 is a graphical illustration of a cross-sectional view of a partially formed IC package, in accordance with one example embodiment of the invention.

FIG. 4 is a graphical illustration of a cross-sectional view of a partially formed IC package, in accordance with one example embodiment of the invention. As shown in package 400, solder balls 402 have been attached amongst stiffening mold 302. In one embodiment, solder ball diameter 404 is about 10 mils. In one embodiment, solder balls 402 are made from a high melting point solder (higher than about 220 degrees Celsius) so as to maintain their integrity through subsequent reflows, for example, a reflow for attaching a topside integrated circuit device. In another embodiment, solder balls 402 are not attached until later in the process after an integrated circuit device has been attached.

Figure 5:
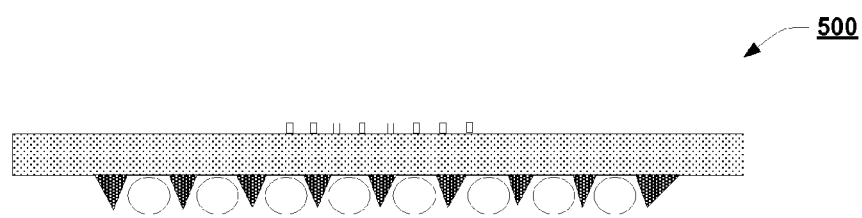
FIG. 5 is a graphical illustration of a cross-sectional view of a partially formed IC package, in accordance with one example embodiment of the invention.

FIG. 5 is a graphical illustration of a cross-sectional view of a partially formed IC package, in accordance with one example embodiment of the invention. As shown in package 500, the package has been flipped over for topside processing.

Figure 6:
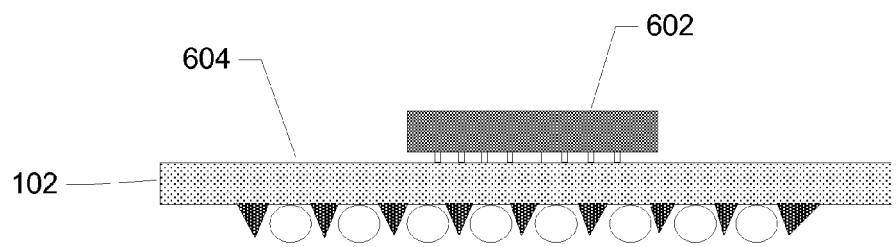
FIG. 6 is a graphical illustration of a cross-sectional view of a partially formed IC package, in accordance with one example embodiment of the invention.

FIG. 6 is a graphical illustration of a cross-sectional view of a partially formed IC package, in accordance with one example embodiment of the invention. As shown in package 600, integrated circuit device 602 has been attached to topside 604 of coreless substrate strip 102. Integrated circuit device 602 may represent any type of silicon processor or controller or logic.

Figure 7:
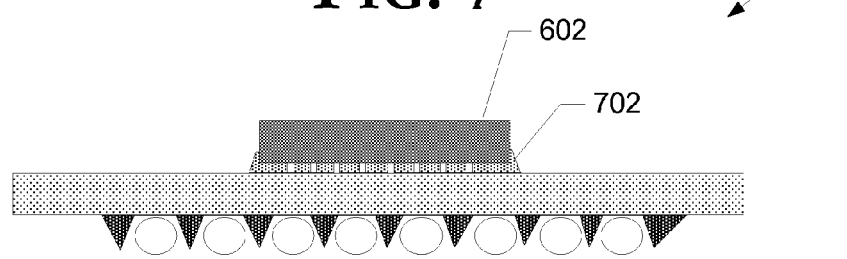
FIG. 7 is a graphical illustration of a cross-sectional view of a partially formed IC package, in accordance with one example embodiment of the invention.

FIG. 7 is a graphical illustration of a cross-sectional view of a partially formed IC package, in accordance with one example embodiment of the invention. As shown in package 700, underfill material 702 has been dispensed under integrated circuit device 602.

Figure 8:
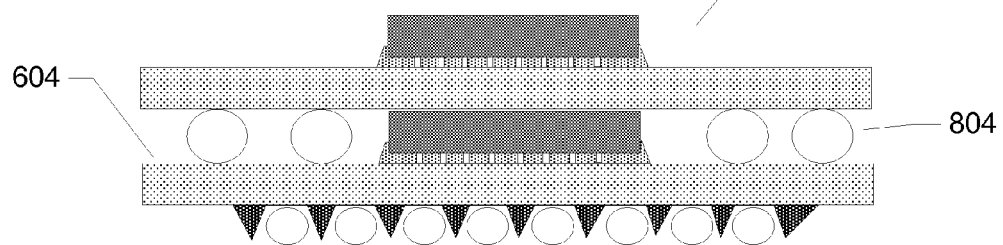
FIG. 8 is a graphical illustration of a cross-sectional view of a partially formed IC package, in accordance with one example embodiment of the invention.

FIG. 8 is a graphical illustration of a cross-sectional view of a partially formed IC package, in accordance with one example embodiment of the invention. As shown in package 800, second integrated circuit device package 802 has been attached to topside 604 through solder balls 804. Second integrated circuit device package 802 may be any type of package and need not be a flip chip package.

In one embodiment, package 800 is processed further and singulated from other packages.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
    receiving a coreless substrate strip; and
    forming a stiffening mold on a backside of the coreless substrate strip adjacent to sites where solder balls are to be attached; and attaching solder balls to the backside of the coreless substrate strip amongst the stiffening mold.

2. The method of claim 1, wherein forming a stiffening mold on a backside of the coreless substrate strip adjacent to sites where solder balls are to be attached comprises:
    dispensing a liquid mold compound; and
    compressing the liquid mold compound with a jig.

3. The method of claim 1, wherein the coreless substrate strip comprises a direct laser lamination generation 3(DLL3) strip.

4. The method of claim 1, further comprising attaching an integrated circuit device to a topside of the coreless substrate strip.

5. The method of claim 4, further comprising attaching a second integrated circuit device package to the topside of the coreless substrate strip.

6. A method comprising:
    receiving a laser lamination coreless substrate strip; and
    forming a stiffening mold on a backside of the laser lamination coreless substrate strip adjacent to sites where solder balls are to be attached; and attaching solder balls to the backside of the laser lamination coreless substrate strip amongst the stiffening mold.

7. The method of claim 6, wherein the laser lamination coreless substrate strip comprises a thickness of about 200 micrometers.

8. The method of claim 6 wherein the backside stiffening mold comprises a thickness of about 100 micrometers.

9. The method of claim 6, wherein forming a stiffening mold on a backside of the laser lamination coreless substrate strip adjacent to sites where solder balls are to be attached comprises:
    dispensing a liquid mold compound; and
    compressing the liquid mold compound with a jig.

10. The method of claim 6, further comprising attaching an integrated circuit device to a topside of the coreless substrate strip.

11. The method of claim 10, further comprising attaching a second integrated circuit device package to the topside of the coreless substrate strip.

12. A method comprising:
    dispensing a liquid mold compound adjacent to contact sites for solder balls on a coreless substrate strip;
    curing the liquid mold compound to form a stiffening mold; and
    attaching solder balls to the backside of the coreless substrate strip amongst the stiffening mold.

13. The method of claim 12, wherein dispensing a liquid mold compound adjacent to contact sites for solder balls on a coreless substrate strip includes dispensing a liquid mold compound on a direct laser lamination generation 3(DLL3) strip.

14. The method of claim 12, further including compressing the liquid mold compound with a jig to form the stiffening mold.

* * * * *